(12) United States Patent
Takemura et al.

(10) Patent No.: US 10,014,239 B2
(45) Date of Patent: Jul. 3, 2018

(54) INFORMATION PROCESSING DEVICE AND COOLING UNIT

(71) Applicant: FUJITSU LIMITED, Kawasaki-shi, Kanagawa (JP)

(72) Inventors: Keizou Takemura, Kawasaki (JP); Jie Wei, Hachioji (JP); Mitsutaka Yamada, Atsugi (JP); Michimasa Aoki, Kawasaki (JP); Masumi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/607,851

(22) Filed: May 30, 2017

(65) Prior Publication Data

US 2018/0005921 A1 Jan. 4, 2018

(30) Foreign Application Priority Data

Jun. 30, 2016 (JP) ................................ 2016-130415

(51) Int. Cl.
*H01L 23/473* (2006.01)
*H05K 7/20* (2006.01)
*H05K 1/02* (2006.01)
*G06F 1/20* (2006.01)

(52) U.S. Cl.
CPC ......... *H01L 23/473* (2013.01); *H05K 1/0203* (2013.01); *H05K 7/20254* (2013.01); *H05K 7/20272* (2013.01); *H05K 7/20509* (2013.01); *H05K 7/20772* (2013.01); *G06F 1/20* (2013.01)

(58) Field of Classification Search
CPC ....... H05K 7/20254; H05K 7/20627–7/20636; H05K 7/20763–7/20772; H01L 23/473
See application file for complete search history.

(56) References Cited

U.S. PATENT DOCUMENTS

| 5,509,468 | A | * | 4/1996 | Lopez | ...................... | F28F 3/12 |
|---|---|---|---|---|---|---|
| | | | | | | 165/144 |
| 5,740,018 | A | * | 4/1998 | Rumbut, Jr. | ....... | H05K 7/20563 |
| | | | | | | 165/46 |
| 7,187,550 | B1 | * | 3/2007 | Heydari | ................ | H01L 23/473 |
| | | | | | | 165/104.33 |
| 7,367,384 | B2 | * | 5/2008 | Madara | .................... | G06F 1/203 |
| | | | | | | 165/122 |
| 7,380,409 | B2 | * | 6/2008 | Campbell | .......... | H05K 7/20772 |
| | | | | | | 165/104.33 |
| 7,965,509 | B2 | * | 6/2011 | Campbell | ............. | H01L 23/473 |
| | | | | | | 165/104.33 |
| 8,004,839 | B2 | * | 8/2011 | Sato | .................... | H05K 7/20754 |
| | | | | | | 165/104.33 |

(Continued)

FOREIGN PATENT DOCUMENTS

JP 07-297505 11/1995
JP 2012-128710 A 7/2012

*Primary Examiner* — Robert J Hoffberg
(74) *Attorney, Agent, or Firm* — Squire Patton Boggs (US) LLP

(57) ABSTRACT

An information processing device includes a substrate configured to include a mounting surface above which an electronic component is mounted; a flow passage configured to include a flow path through which a cooling medium flows and be arranged above the mounting surface; and a cooler configured to be detachably coupled with the flow passage and cool the electronic component.

20 Claims, 12 Drawing Sheets

(56) References Cited

U.S. PATENT DOCUMENTS

| | | | | |
|---|---|---|---|---|
| 8,027,162 B2* | 9/2011 | Campbell | ............ | H05K 7/2079 165/104.33 |
| 8,081,473 B2* | 12/2011 | Cipolla | ............... | H01L 23/4093 165/104.33 |
| 8,456,833 B2* | 6/2013 | Eagle | ................ | H05K 7/20254 165/104.33 |
| 8,493,738 B2* | 7/2013 | Chainer | ............ | H05K 7/20772 361/679.53 |
| 8,587,943 B2* | 11/2013 | Barina | ................ | H01L 23/427 165/104.33 |
| 8,599,557 B2* | 12/2013 | Peterson | .................. | G06F 1/20 165/104.21 |
| 8,611,087 B2* | 12/2013 | Sato | .................. | H05K 7/20754 211/26 |
| 8,638,559 B2* | 1/2014 | Barina | ................ | H01L 23/4093 165/104.21 |
| 8,867,205 B2* | 10/2014 | Eagle | ................ | H05K 7/20254 165/104.33 |
| 9,215,832 B2* | 12/2015 | Chang | ................ | H05K 7/20781 |
| 9,253,920 B2* | 2/2016 | Rossi | ................ | H05K 7/20254 |
| 9,292,058 B2* | 3/2016 | Demange | ........... | H05K 7/20218 |
| 9,723,760 B2* | 8/2017 | Hall | .................. | H05K 7/20745 |
| 2008/0251240 A1* | 10/2008 | Madara | ................... | G06F 1/203 165/122 |

\* cited by examiner

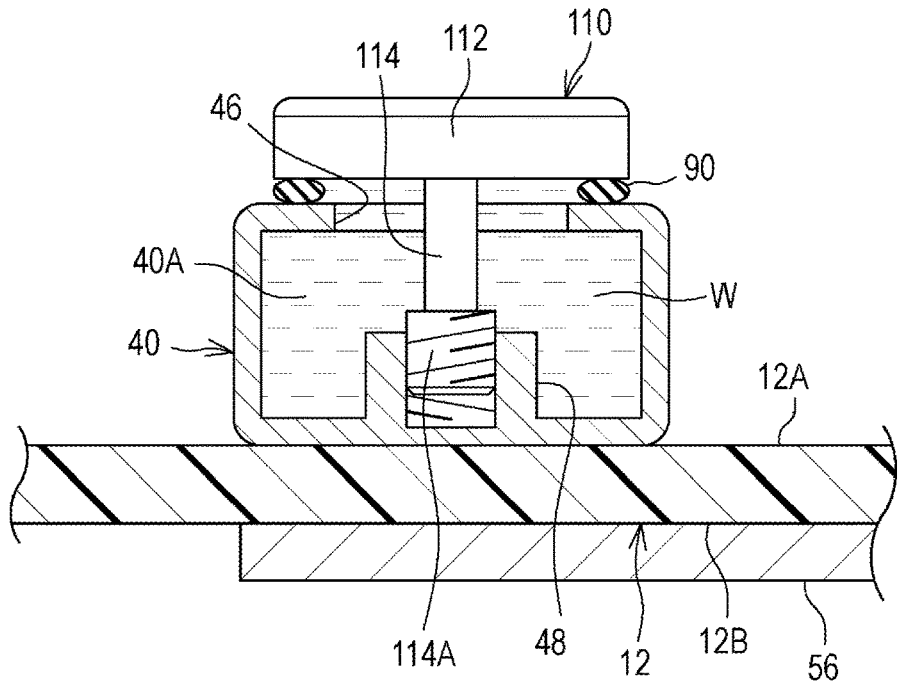
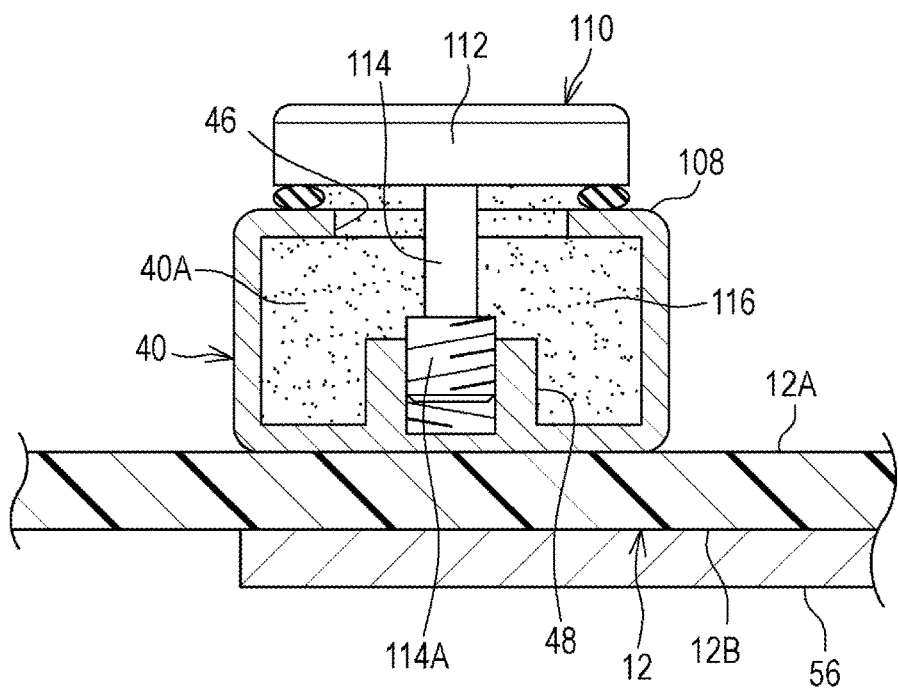

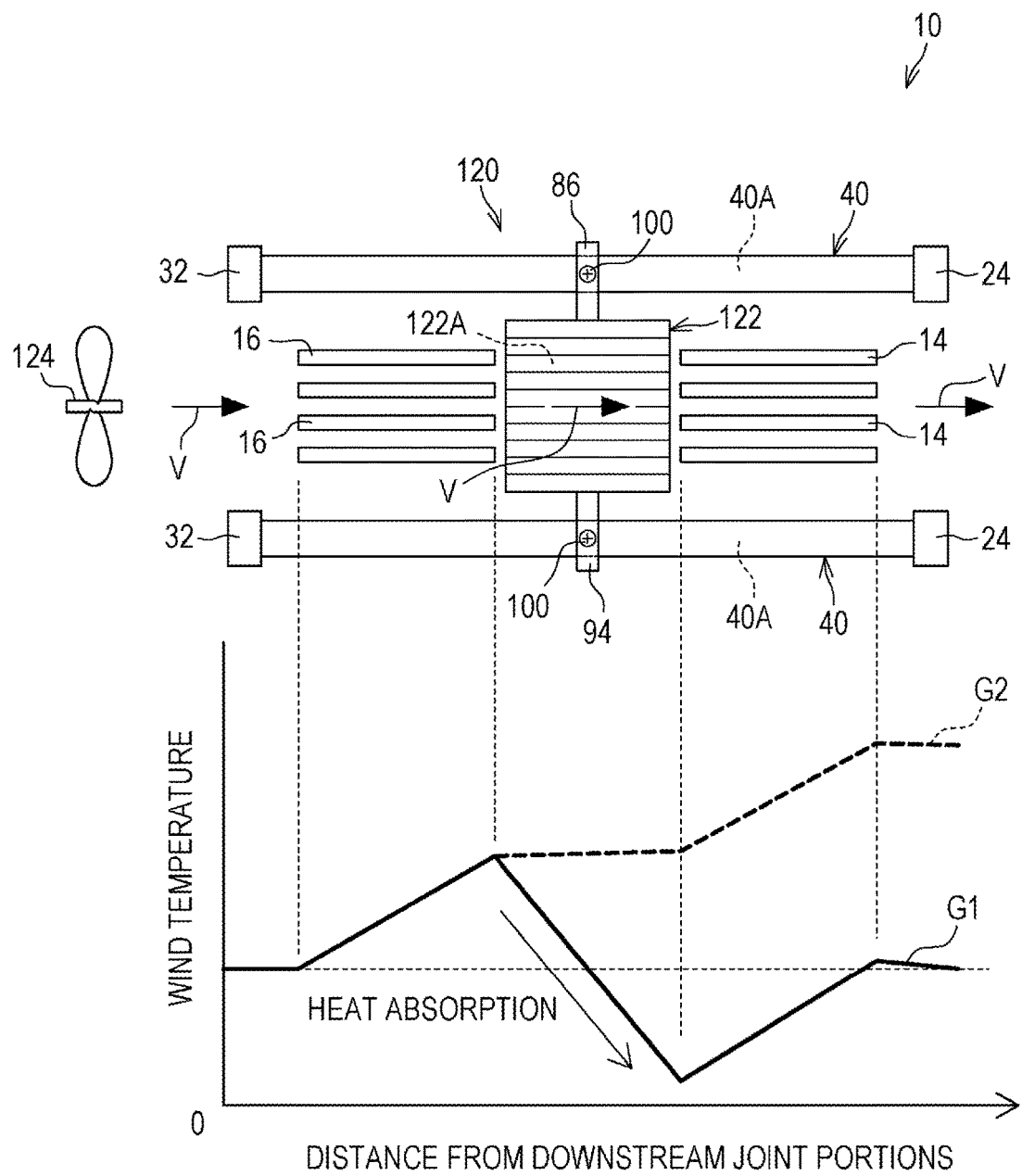

INFORMATION PROCESSING DEVICE AND COOLING UNIT

CROSS-REFERENCE TO RELATED APPLICATION

This application is based upon and claims the benefit of priority of the prior Japanese Patent Application No. 2016-130415, filed on Jun. 30, 2016, the entire contents of which are incorporated herein by reference.

FIELD

The embodiments discussed herein are related to an information processing device and a cooling unit.

BACKGROUND

There have been cooling apparatuses that cool an electronic component mounted on a substrate by using a cooling medium (for example, see Japanese Laid-open Patent Publication No. 2012-128710 and Japanese Laid-open Patent Publication No. 7-297505). This kind of cooling apparatus is connected with piping and is supplied with a cooling medium via the piping.

SUMMARY

According to an aspect of the invention, an information processing device includes a substrate configured to include a mounting surface above which an electronic component is mounted; a flow passage configured to include a flow path through which a cooling medium flows and be arranged above the mounting surface; and a cooler configured to be detachably coupled with the flow passage and cool the electronic component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8A is a cross-sectional view taken along line VIIIA-VIIIA in FIG. 6;

FIG. 8B is a cross-sectional view taken along line VIIIB-VIIIB in FIG. 6;

FIG. 12 is a plan view that illustrates a cooler in a third embodiment and is an explanatory diagram that illustrates a graph which represents the temperature of wind flowing between a pair of pieces of the sub-piping in the third embodiment.

DESCRIPTION OF EMBODIMENTS

Incidentally, in a case where a worker replaces an electronic component from a substrate including the electronic component and a cooling apparatus or a cooler, the cooling apparatus may be removed from the substrate in order to avoid interference between the electronic component and the cooling unit, for example.

In a case where the piping is joined to the cooling apparatus by welding or the like, the worker removes the cooling apparatus and the piping from the substrate. Thus, replacement work of the electronic component possibly requests effort.

It is desirable to reduce effort for replacement work of an electronic component.

First Embodiment

A first embodiment of the techniques disclosed by the present application will hereinafter be described.

<Information Processing Device>

Figure 1:
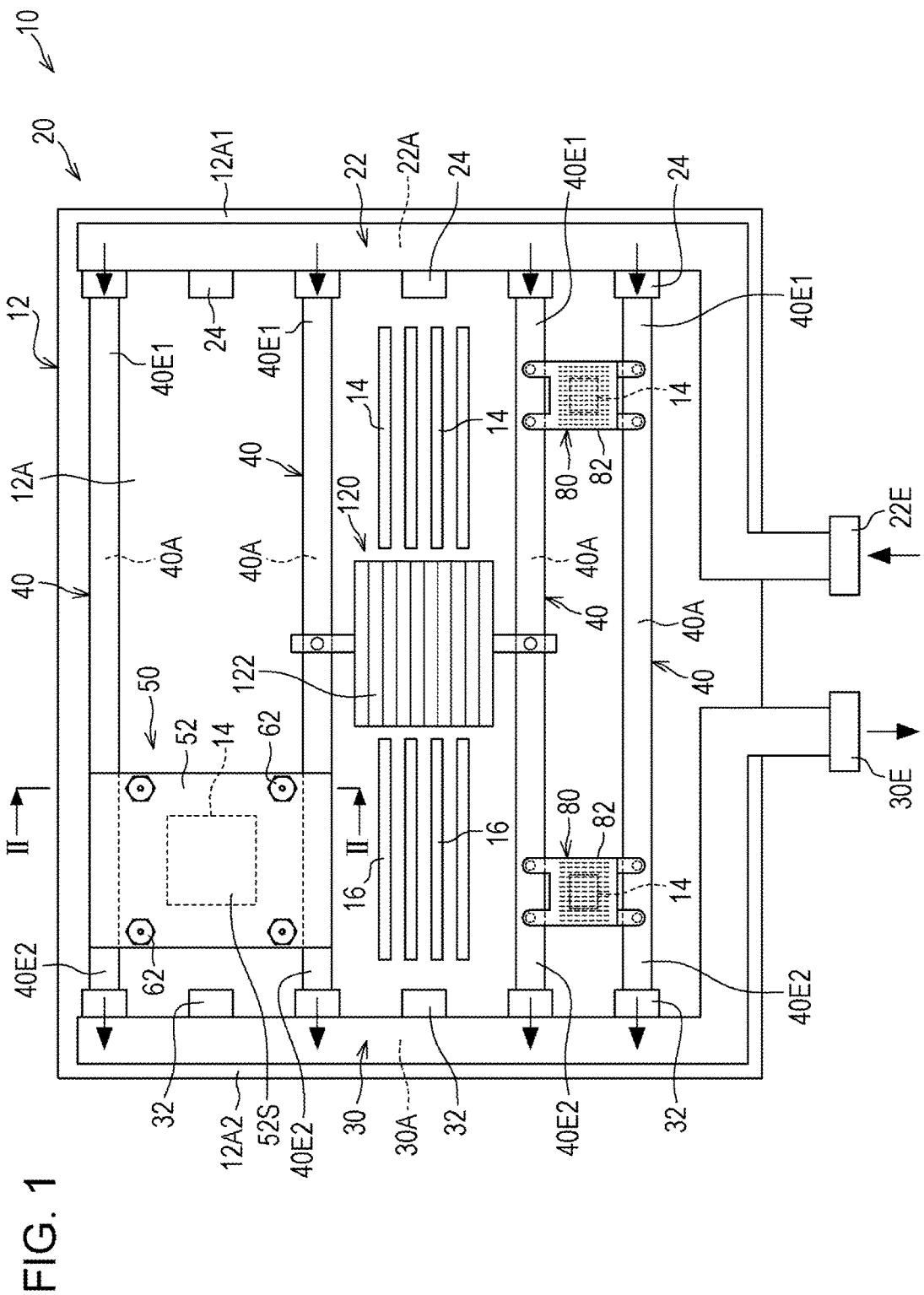
FIG. 1 is a plan view that illustrates a substrate of an information processing device according to a first embodiment.

As illustrated in FIG. 1, an information processing device 10 according to this embodiment includes a substrate 12 and a cooling unit 20. The substrate 12 is a rectangular printed circuit substrate, for example. A front surface of the substrate 12 is a mounting surface 12A on which plural electronic components 14 are mounted. Printed wiring, which is not illustrated, is formed on the mounting surface 12A. A back surface 12B (see FIG. 2) of the substrate 12 may be the mounting surface.

The plural electronic components 14 are a central processing unit (CPU), large-scale integration (LSI), a memory, and so forth, for example. Each of the electronic components 14 is electrically coupled with the printed wiring formed on the mounting surface 12A of the substrate 12. Note that each of the electronic components 14 generates heat by consuming power.

<Cooling Unit>

The cooling unit 20 has upstream main piping 22, downstream main piping 30, sub-piping 40, and plural cooling modules 50. Further, the upstream main piping 22 includes an upstream flow path 22A, through which a cooling medium flows, in an internal portion. Further, the downstream main piping 30 includes a downstream flow path 30A, through which the cooling medium flows, in an internal portion. In addition, the sub-piping 40 has a flow path 40A, through which the cooling medium flows, in an internal portion. Those upstream main piping 22, downstream main piping 30, and sub-piping 40 form a circulation flow path through which the cooling medium circulates.

The upstream main piping 22 is one example of an upstream flow passage. The downstream main piping 30 is one example of a downstream flow passage. In addition, the sub-piping 40 is one example of a flow passage.

The upstream main piping 22 and the downstream main piping 30 are arranged along an outer peripheral portion of the mounting surface 12A of the substrate 12. More specifically, the upstream main piping 22 is arranged along an outer peripheral portion of the mounting surface 12A of the substrate 12 on a one end portion 12A1 side. Meanwhile, the downstream main piping 30 is arranged along an outer peripheral portion of the mounting surface 12A of the substrate 12 on the other end portion 12A2 side. That is, the downstream main piping 30 is arranged on the opposite side to the upstream main piping 22 with respect to the electronic component 14 (cooler or cooling apparatus 52) that is mounted on the mounting surface 12A of the substrate 12.

A cooling-medium cooling device is coupled or connected with one end portion 30E of the downstream main piping 30 via piping which is not illustrated. Accordingly, the cooling medium that is discharged from the one end portion 30E of the downstream main piping 30 is supplied to the cooling-medium cooling device. The cooling-medium cooling device is a freezing machine or a cooling tower that cools the cooling medium, for example. The cooling medium is a liquid such as water, for example. Further, the arrows illustrated in FIG. 1 indicate flows of the cooling medium.

The cooling-medium cooling device is connected with one end portion 22E of the upstream main piping 22 via piping which is not illustrated. Accordingly, the cooling medium that is cooled by the cooling-medium cooling device is supplied to the one end portion 22E of the upstream main piping 22.

The upstream main piping 22 is arranged along the one end portion 12A1 of the mounting surface 12A of the substrate 12. The upstream main piping 22 is provided with plural upstream joints 24.

The plural upstream joints 24 are detachable fluid joints such as a threaded type or a one-touch type. Each of the upstream joints 24 communicates with the upstream flow path 22A. Further, the plural upstream joints 24 are disposed at intervals in the longitudinal direction of the upstream main piping 22. In addition, the plural upstream joints 24 are arranged on a central portion side of the substrate 12 (on the downstream main piping 30 side) with respect to the upstream main piping 22. Each of the upstream joints 24 is detachably coupled with one end portion 40E1 of the sub-piping 40, which will be described later.

The downstream main piping 30 is arranged along the other end portion 12A2 of the mounting surface 12A of the substrate 12. The downstream main piping 30 is provided with plural downstream joints 32.

The plural downstream joints 32 are detachable fluid joints such as a threaded type or a one-touch type. Each of the downstream joints 32 communicates with the downstream flow path 30A. Further, the plural downstream joints 32 are disposed at intervals in the longitudinal direction of the downstream main piping 30. In addition, the plural downstream joints 32 are arranged on a central portion side of the substrate 12 (on the upstream main piping 22 side) with respect to the downstream main piping 30. Each of the downstream joints 32 is detachably coupled with the other end portion 40E2 of the sub-piping 40, which will be described later.

<Sub-Piping>

Plural pieces of the sub-piping 40 are linear piping, for example. Further, the plural pieces of the sub-piping 40 are arranged on the mounting surface 12A of the substrate 12. The one end portion 40E1 (upstream end portion) of each piece of the sub-piping 40 is detachably coupled with any of the plural upstream joints 24 in a state where the flow path 40A is connected with the upstream flow path 22A.

Meanwhile, the other end portion 40E2 (downstream end portion) of each piece of the sub-piping 40 is detachably coupled with any of the plural downstream joints 32 in a state where the flow path 40A is connected with the downstream flow path 30A. Accordingly, the upstream main piping 22 and the downstream main piping 30 are joined together by the plural pieces of the sub-piping 40. That is, plural flow paths 40A are formed between the upstream main piping 22 and the downstream main piping 30.

In this embodiment, among six upstream joints 24, four upstream joints 24 are coupled with the respective pieces of the sub-piping 40. Among six downstream joints 32, four downstream joints 32 are coupled with the respective pieces of the sub-piping 40. Then, the upstream main piping 22 and the downstream main piping 30 are joined together by the four pieces of the sub-piping 40.

Here, the sub-piping 40 is arranged between the neighboring electronic components 14 so as not to interfere with the electronic components 14. Further, the pieces of the sub-piping 40 are arranged on both sides of the electronic components 14 for which cooling apparatuses (or coolers) 52, 82, and 122 are placed. In other words, the electronic components 14 are arranged between respective pairs of the neighboring pieces of the sub-piping 40.

<Cooling Module>

Three kinds of cooling modules 50, 80, and 120 are provided on the mounting surface 12A of the substrate 12. Thus, in this embodiment, the cooling module 50 will be described. The cooling modules 80 and 120 will be described later in second and third embodiments.

Figure 2:
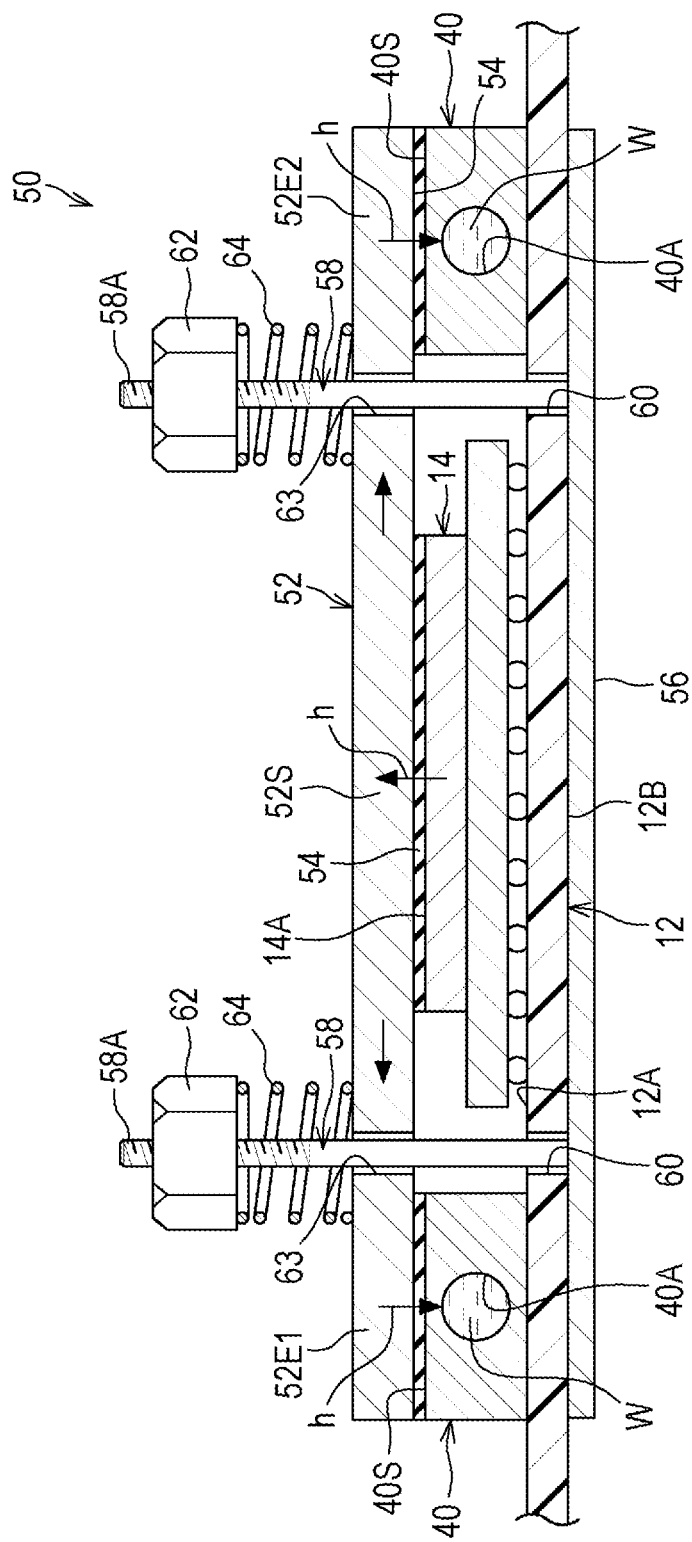
FIG. 2 is a cross-sectional view taken along line II-II in FIG. 1.

As illustrated in FIG. 2, the cooling module 50 includes the cooling apparatus (cooler) 52, a base plate 56, plural fixing poles 58, plural nuts 62, and plural elastic members 64. The cooling apparatus 52 is heat conductive and is a heat exchanger that performs heat exchange between the electronic components 14 and the sub-piping 40. The cooling apparatus 52 is formed with a metal material with high heat conductivity such as aluminum or copper and into a plate shape, for example.

A central portion of the cooling apparatus 52 is a heat absorbing portion 52S. The heat absorbing portion 52S is placed on or above the electronic component 14 so as to be capable of heat exchange with the electronic component 14. Specifically, an upper surface of the electronic component 14 is a flat surface 14A. The heat absorbing portion 52S of the cooling apparatus 52 is placed on or above the flat surface 14A of the electronic component 14 via a heat conductive member 54. Accordingly, the heat absorbing portion 52S becomes capable of heat exchange with the electronic component 14.

The heat conductive member 54 is made of heat conductive material. As the heat conductive member 54, a thermal interface material (TIM) such as heat conductive rubber, heat conductive grease, or a heat conductive sheet with high heat conductivity is used, for example. Accordingly, the heat conduction efficiency between the electronic component 14 and the cooling apparatus 52 is enhanced.

The cooling apparatus 52 is arranged across a pair of pieces of the sub-piping 40 that are arranged on both sides of the electronic component 14. One end portion 52E1 of the cooling apparatus 52 is placed on one piece of the sub-piping 40 so as to be capable of heat exchange with the sub-piping 40.

Specifically, a transverse cross-sectional shape of the sub-piping 40 is formed in a rectangular shape. Further, the flow path 40A through which a cooling medium W flows is formed in the internal portion of the sub-piping 40. An upper surface of the sub-piping 40 is a flat connection surface 40S. A lower surface of the one end portion 52E1 of the cooling apparatus 52 makes surface contact with the connection surface 40S via the heat conductive member 54. Accordingly, the one end portion 52E1 of the cooling apparatus 52 becomes capable of heat exchange with the cooling medium W that flows through the flow path 40A via the sub-piping 40. Further, the heat conductive member 54 enhances the heat conduction efficiency between the cooling apparatus 52 and the sub-piping 40.

Similarly to this, the other end portion 52E2 of the cooling apparatus 52 is connected or coupled with the connection surface 40S of the other sub-piping 40 via the heat conductive member 54. Accordingly, the other end portion 52E2 of the cooling apparatus 52 becomes capable of heat exchange with the sub-piping 40.

The base plate 56 is arranged on the back surface 12B side of the substrate 12. Further, the base plate 56 is formed into a rectangular plate shape. The fixing pole 58 is provided to stand in each corner portion of the base plate 56. Each of the fixing poles 58 is inserted in an attachment hole 60 that is formed in the substrate 12 and is inserted in an attachment hole 63 that is formed in the cooling apparatus 52.

A male thread portion 58A is provided in a tip portion (upper end portion) of the fixing pole 58. The nut 62 is attached on the male thread portion 58A. In addition, the elastic member 64 is arranged between the nut 62 and the cooling apparatus 52. Thus, in a case where the nut 62 is fastened to the fixing pole 58, the elastic member 64 is retained between the nut 62 and the cooling apparatus 52 in a state where the elastic member 64 is compressed. Accordingly, the cooling apparatus 52 is detachably connected or coupled with the connection surfaces 40S of the pieces of the sub-piping 40 on both sides of the electronic component 14.

The heat absorbing portion 52S of the cooling apparatus 52 is placed on the flat surface 14A of the electronic component 14 via the heat conductive member 54 by an urging force (restoring force) of the elastic member 64. Further, the one end portion 52E1 and the other end portion 52E2 of the cooling apparatus 52 are pressed against the connection surfaces 40S of a pair of pieces of the sub-piping 40 via the heat conductive members 54. This enhances the heat conduction efficiency between the heat absorbing portion 52S of the cooling apparatus 52 and the electronic component 14 and between the one end portion 52E1 and the other end portion 52E2 of the cooling apparatus 52 and the pair of pieces of the sub-piping 40.

Next, functions of the first embodiment will be described.

As illustrated in FIG. 1, the cooled cooling medium is supplied from the cooling-medium cooling device, which is not illustrated, to the one end portion 22E of the upstream main piping 22. As indicated by the arrows, the cooling medium is supplied to each of the flow paths 40A of the plural pieces of the sub-piping 40 via the upstream flow path 22A of the upstream main piping 22.

The cooling medium that is supplied to the plural pieces of the sub-piping 40 is supplied to the downstream flow path 30A of the downstream main piping 30. In addition, the cooling medium that is supplied to the downstream flow path 30A is supplied from the one end portion 30E of the downstream main piping 30 to the cooling-medium cooling device and is cooled by the cooling-medium cooling device. The cooling medium that is cooled by the cooling-medium cooling device is again supplied to the one end portion 22E of the upstream main piping 22.

Here, as indicated by arrow h in FIG. 2, the heat of the electronic component 14 is transmitted to the sub-piping 40 via the cooling apparatus (cooler) 52. In addition, the heat of the electronic component 14 that is transmitted to the sub-piping 40 is emitted to the cooling medium W that flows through the flow paths 40A of the sub-piping 40. Accordingly, the electronic component 14 is cooled.

Further, the cooling apparatus 52 performs heat exchange with the pair of pieces of the sub-piping 40 that are arranged on both sides of the electronic component 14. That is, the cooling apparatus 52 emits the heat of the electronic component 14 to the pair of pieces of the sub-piping 40. Accordingly, in this embodiment, the cooling efficiency of the electronic component 14 is improved compared to a case where the cooling apparatus 52 performs heat exchange with only one piece of the sub-piping 40.

Figure 3:
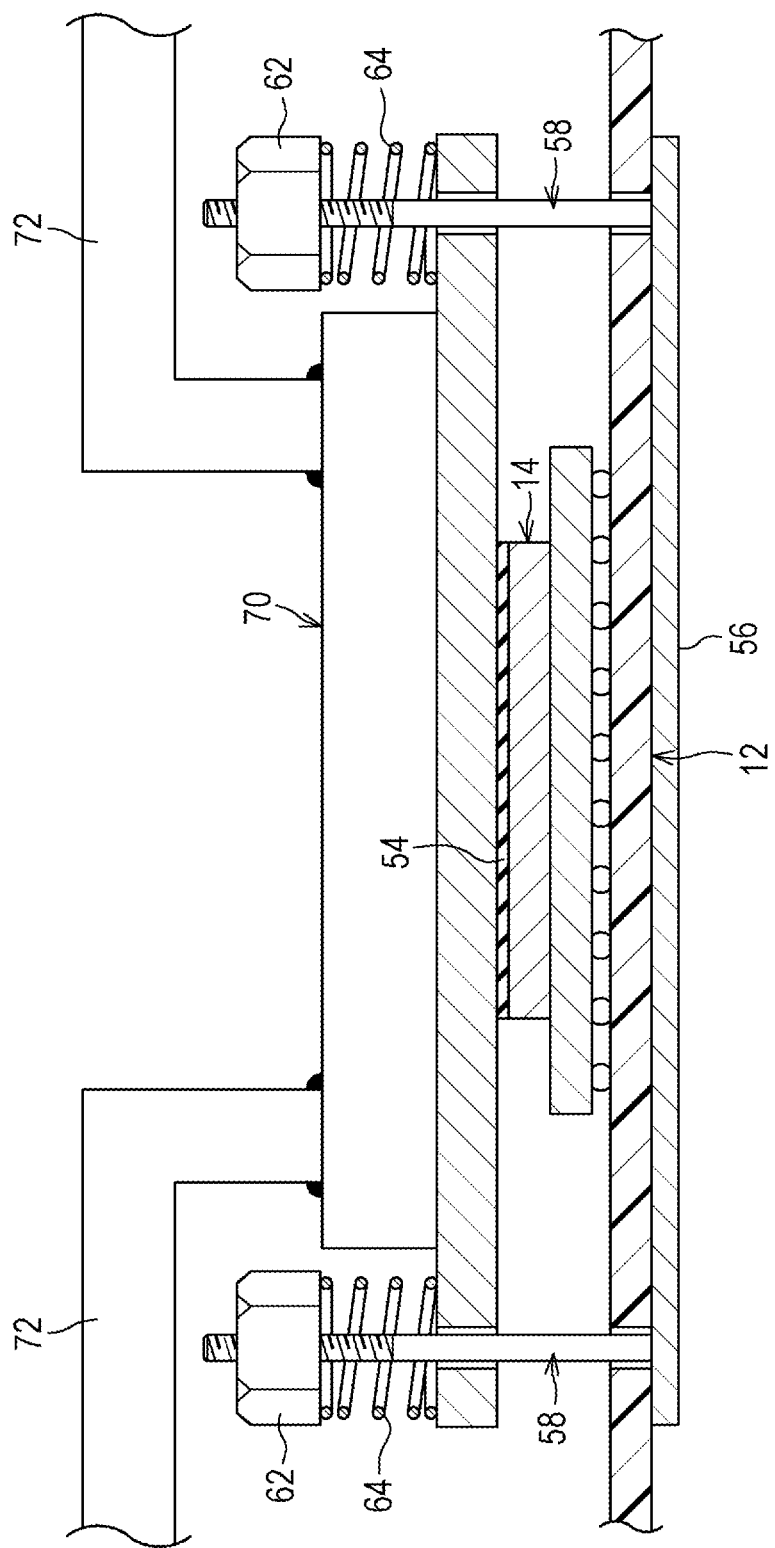
FIG. 3 is a cross-sectional view that illustrates a cooler according to a comparative example and corresponds to FIG. 2.

Incidentally, for example, as a comparative example illustrated in FIG. 3, in a case where piping 72 is joined by welding or the like to a cooling apparatus 70 that has an internal flow path (not illustrated) through which the cooling medium flows, the cooling apparatus 70 and the piping 72 are removed from the substrate 12 when the electronic component 14 is replaced. Thus, replacement work of the electronic component 14 possibly requests effort.

On the other hand, in this embodiment, the cooling apparatus 52 is detachably connected or coupled with the pair of pieces of the sub-piping 40 by the plural nuts 62. Accordingly, for example, in a case where a worker replaces an electronic component 14, the cooling apparatus 52 may be removed from the electronic component 14 without removing the pair of pieces of the sub-piping 40 from the substrate 12. Accordingly, in this embodiment, the effort for the replacement work of the electronic component 14 is reduced compared to the cooling apparatus 70 according to the comparative example.

Further, for example, the worker changes the positions of the attachment holes 60 of the substrate 12 and thereby easily changes the attachment position of the cooling apparatus 52 with respect to the sub-piping 40. Accordingly, for example, the positioning of the cooling apparatus 52 may easily be changed in accordance with the change in the positioning of the electronic component 14.

In addition, the upstream main piping 22 is provided with the plural upstream joints 24, and the downstream main piping 30 is provided with the plural downstream joints 32. Accordingly, the arrangement of the sub-piping 40 may easily be changed in accordance with the positioning of the electronic component 14. In addition, the plural pieces of the sub-piping 40 are regularly arranged between the upstream main piping 22 and the downstream main piping 30. Accordingly, the plural electronic components 14 may be mounted on the mounting surface 12A between the neighboring pieces of the sub-piping 40 at high density.

Furthermore, the upstream main piping 22 and the downstream main piping 30 are arranged along an outer peripheral portion of the substrate 12. Accordingly, a wide mounting space for the electronic components 14 may be secured in the central portion of the substrate 12.

[Modification Examples]

Next, modification examples of the first embodiment will be described.

Figure 4:
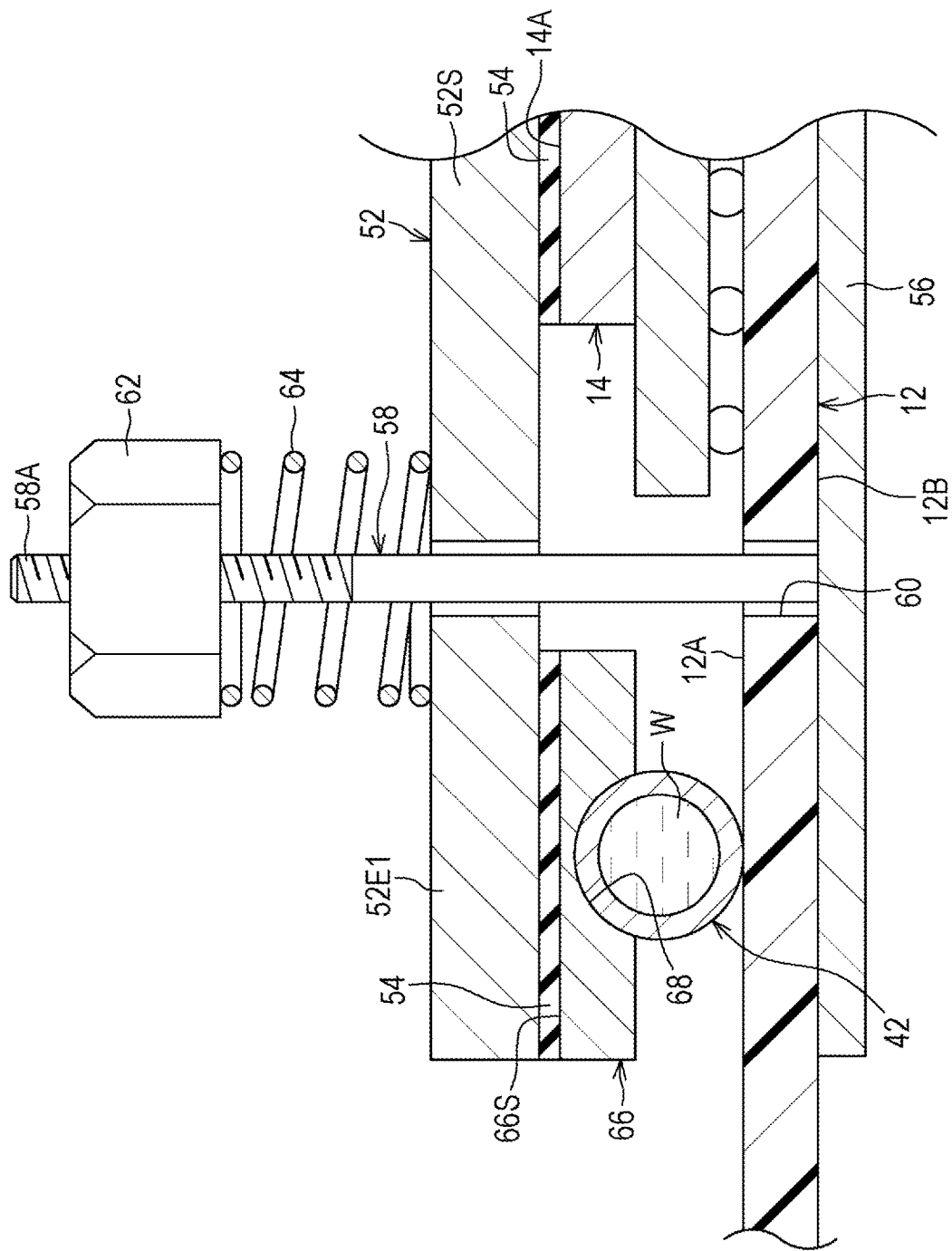
FIG. 4 is a cross-sectional view that illustrates a modification example of sub-piping in the first embodiment and corresponds to a partial enlarged view of FIG. 2.

In the modification example illustrated in FIG. 4, the transverse cross-sectional shape of sub-piping 42 is formed in a circular shape (cylindrical shape). Further, the cooling apparatus (cooler) 52 is placed on the sub-piping 42 via a pedestal 66. The pedestal 66 is formed into a block shape.

A recess 68 in which the sub-piping 42 is fitted is formed in a lower surface of the pedestal 66. Meanwhile, an upper surface of the pedestal 66 is a flat connection surface 66S. The cooling apparatus 52 makes surface contact with the connection surface 66S of the pedestal 66 via the heat conductive member 54. This improves the heat conduction efficiency between the cooling apparatus 52 and the sub-piping 42 and also improves stability of the cooling apparatus 52.

Figure 5:
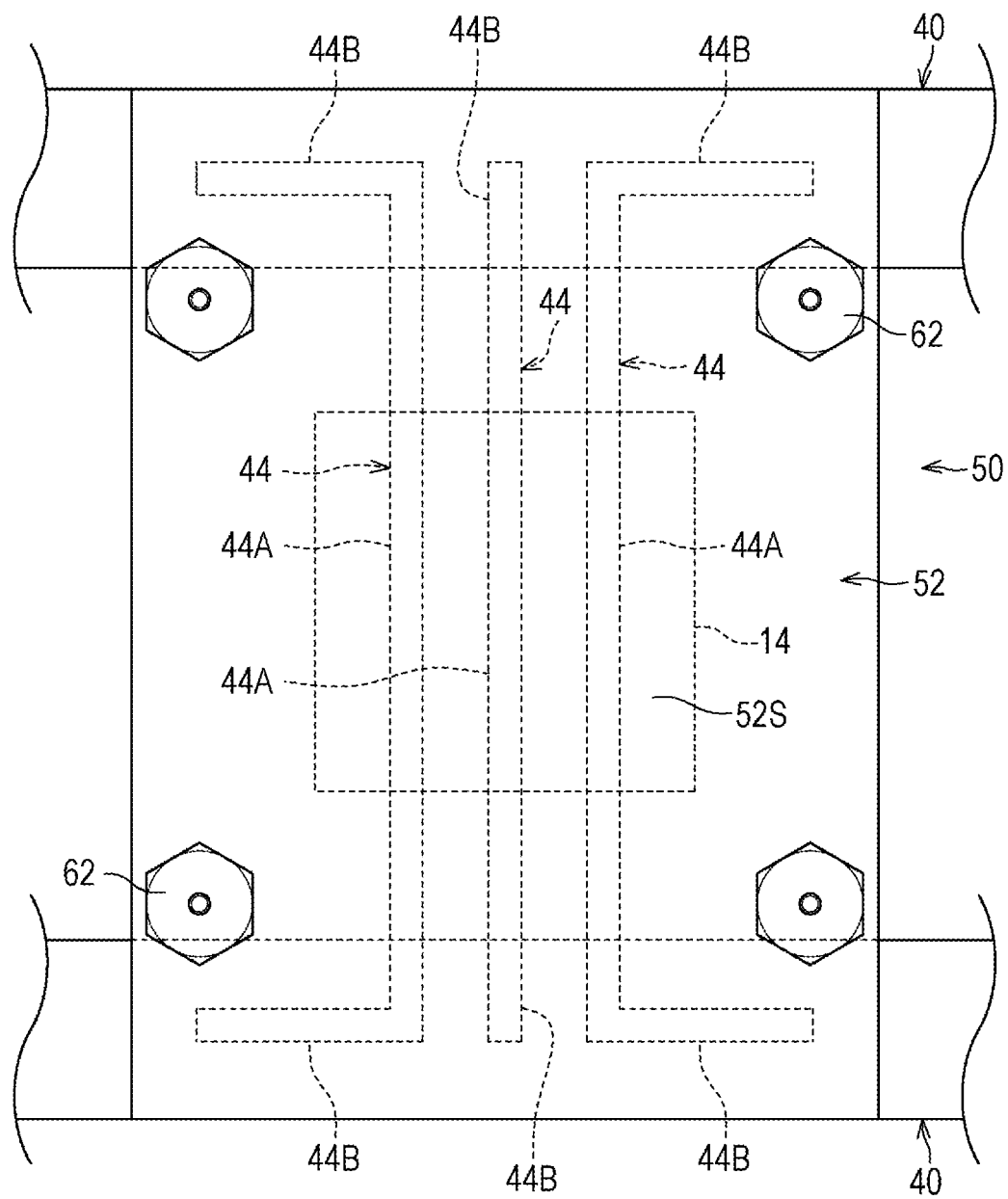
FIG. 5 is a plan view that illustrates a modification example of a cooler according to the first embodiment.

Further, in the modification example illustrated in FIG. 5, the cooling apparatus 52 is provided with plural heat pipes 44. A working liquid, which is not illustrated, is sealed in an internal portion of each of the heat pipes 44. Those heat pipes 44 are embedded in an internal portion of the cooling apparatus 52.

Each of the heat pipes 44 includes an evaporating portion 44A and a pair of condensing portions 44B. The evaporating portion 44A is provided in an intermediate portion of the heat pipe 44 in the longitudinal direction and is arranged in the heat absorbing portion 52S. The evaporating portion 44A is arranged on the electronic component 14 so as to be capable of heat exchange with the electronic component 14. Meanwhile, the pair of condensing portions 44B are provided in both end portions of the heat pipe 44 in the longitudinal direction. The pair of condensing portions 44B are arranged on the pair of pieces of the sub-piping 40 so as to be capable of heat exchange with the pieces of the sub-piping 40.

Here, when the working liquid in the evaporating portion 44A of the heat pipe 44 evaporates due to heat of the electronic component 14, latent heat of evaporation is taken from the electronic component 14. Accordingly, the electronic component 14 is cooled. Further, the working liquid in a gaseous phase state, which evaporates in the evaporating portion 44A, moves to the condensing portions 44B and is cooled by the sub-piping 40 and condensed.

The working liquid in a liquid phase state, which is condensed in the condensing portions 44B, is supplied to the evaporating portion 44A via a wick which is not illustrated, for example, and is again evaporated in the evaporating portion 44A. Heat moves between the electronic component 14 and the sub-piping 40 via the working liquid. That is, heat exchange between the electronic component 14 and the sub-piping 40 is facilitated. Accordingly, because the heat exchange efficiency between the electronic component 14 and the sub-piping 40 is improved, the cooling efficiency of the electronic component 14 is improved.

Second Embodiment

Next, the second embodiment will be described. In the second embodiment, members in the same configurations as the first embodiment are provided with the same reference characters, and descriptions thereof will appropriately be omitted.

Figure 6:
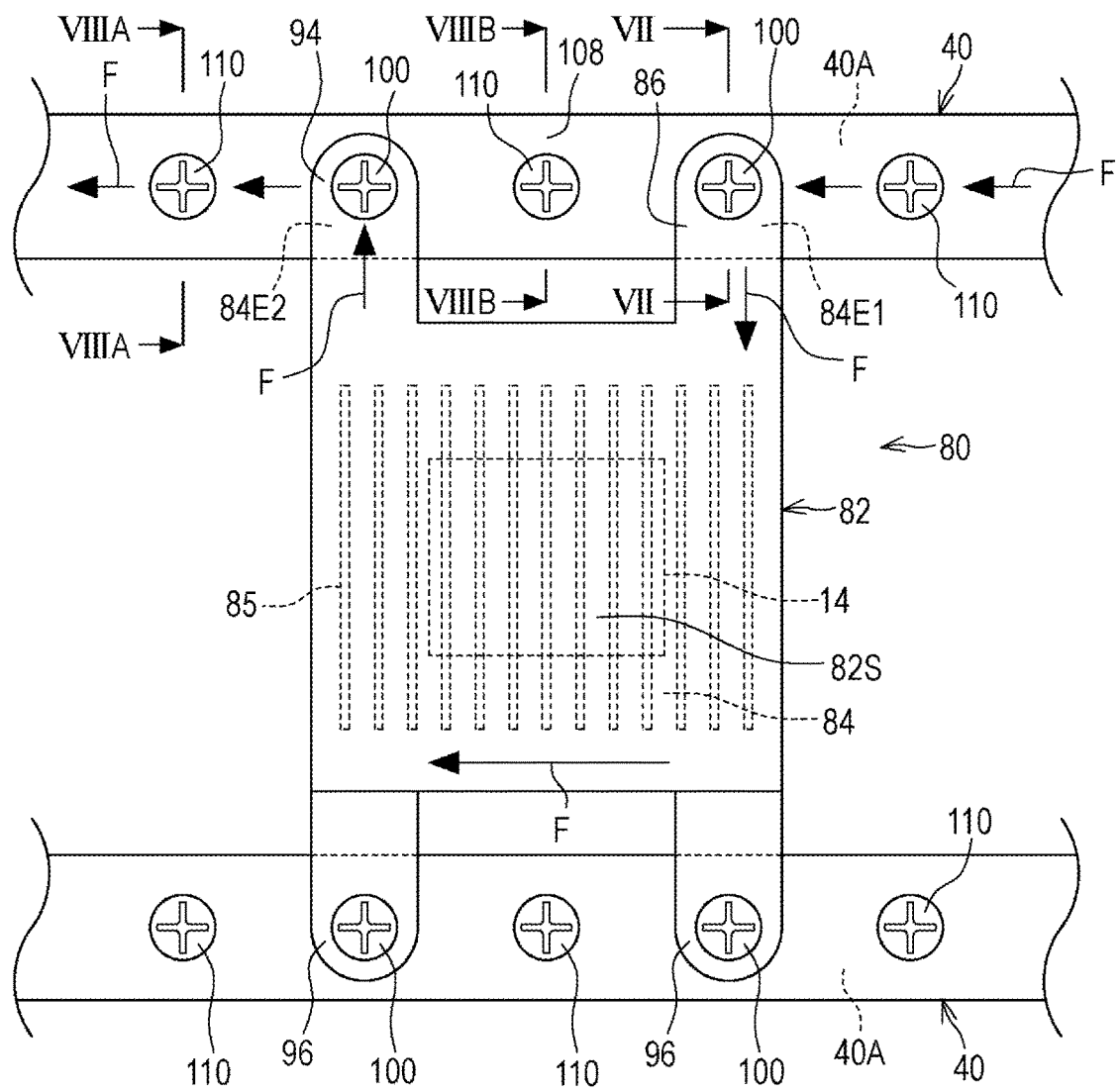
FIG. 6 is a plan view that illustrates a cooler according to a second embodiment.

As illustrated in FIG. 6, the cooling module 80 according to the second embodiment includes the cooling apparatus (cooler) 82. The cooling apparatus 82 performs heat exchange between the cooling medium supplied from one piece of the sub-piping 40 of the pair of pieces of the sub-piping 40 and the electronic component 14 and thereby cools the electronic component 14.

Specifically, the cooling apparatus 82 is arranged across the pair of pieces of the sub-piping 40. A central portion of the cooling apparatus 82 is a heat absorbing portion 82S that performs heat exchange with the electronic component 14. The heat absorbing portion 82S is placed on or above the electronic component 14 via the heat conductive member 54 (see FIG. 7).

The cooling apparatus 82 includes an internal flow path 84 through which the cooling medium flows. The cooling medium is supplied from the flow path 40A of the one piece of the sub-piping 40 to one end portion 84E1 of the internal flow path 84. Further, an intermediate portion (a portion) of the internal flow path 84 is arranged in the heat absorbing portion 82S of the cooling apparatus 82. Accordingly, in the heat absorbing portion 82S, heat exchange is performed between the cooling medium that flows through the internal flow path 84 and the electronic component 14. As a result, the electronic component 14 is cooled. Further, the cooling medium that has performed heat exchange with the electronic component 14 is discharged from the other end portion 84E2 of the internal flow path 84 to the one piece of the sub-piping 40.

A fin 85 that partitions the internal flow path 84 is appropriately formed in the cooling apparatus 82. Further, arrows F indicate the flow of the cooling medium.

<Connection Structure of Cooling Apparatus>

Next, a description will be made about a connection structure and an attachment structure of the cooling apparatus (cooler) 82 to the pair of pieces of the sub-piping 40. First, a description will be made about the connection structure of the cooling apparatus 82 to the one piece of the sub-piping 40. The one piece of the sub-piping 40 includes plural connection holes 46. The plural connection holes 46 (see FIG. 7) are arranged at intervals in the longitudinal direction of the sub-piping 40. Each of the connection holes 46 communicates with the flow path 40A in the sub-piping 40.

Figure 7:
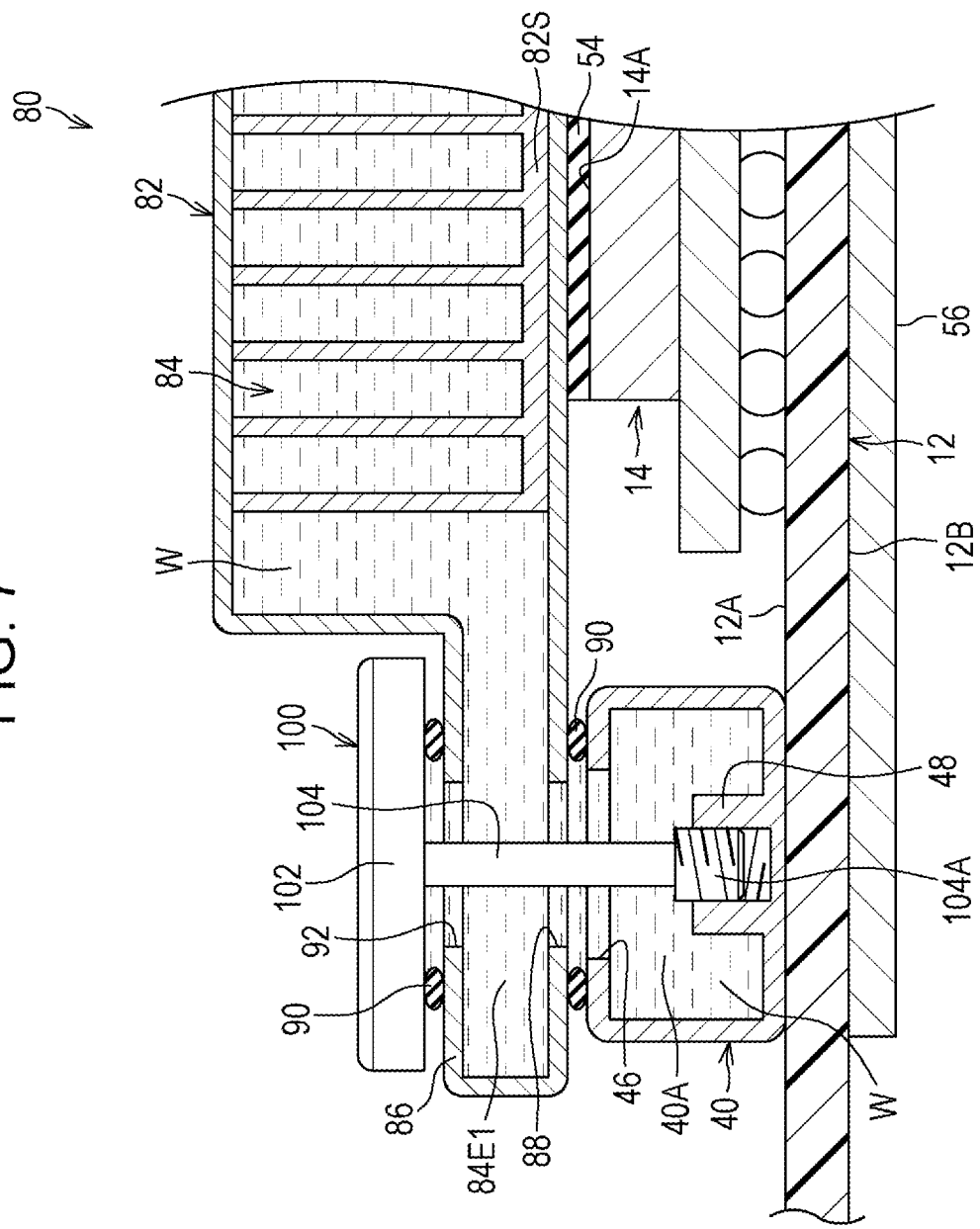
FIG. 7 is a cross-sectional view taken along line VII-VII in FIG. 6.

As illustrated in FIG. 6, the cooling apparatus 82 includes an upstream connection portion 86 and a downstream connection portion 94 that are detachably connected or coupled with the one piece of the sub-piping 40. As illustrated in FIG. 7, the one end portion 84E1 of the internal flow path 84 is formed in an internal portion of the upstream connection portion 86. Further, a connection hole 88 that communicates with the internal flow path 84 is formed in a lower surface of the upstream connection portion 86.

The upstream connection portion 86 is placed on the upper surface of the sub-piping 40 via a sealing member (O-ring) 90. In this case, the connection hole 46 of the sub-piping 40 is connected or coupled with the connection hole 88 of the upstream connection portion 86. The sealing member 90 is formed into a ring shape that surrounds the connection holes 46 and 88. The sealing member 90 restrains the cooling medium W from leaking from the connection holes 46 and 88.

An attachment hole 92 that is opposed to the connection hole 88 is formed in an upper surface of the upstream connection portion 86. A shaft portion 104 of an attachment member 100 is inserted in the attachment hole 92. The attachment member 100 is a screw member, for example. The attachment member 100 includes a lid portion 102 and the shaft portion 104.

The lid portion 102 is formed into a disk shape. Further, for example, grooves in a cross shape, with which a tool such as a driver engages, is formed in a surface of the lid portion 102. The lid portion 102 is situated on the upper surface of the upstream connection portion 86 via the sealing member 90. The lid portion 102 closes the attachment hole 92. Further, the sealing member 90 in a ring shape that surrounds the attachment hole 92 restrains the cooling medium W from leaking from the attachment hole 92.

The shaft portion 104 extends out from a lower surface of the lid portion 102 and is inserted in the attachment hole 92 and the connection holes 46 and 88. A male thread portion 104A is provided in a tip portion of the shaft portion 104. Meanwhile, a boss portion 48 in a tubular shape is formed on a bottom portion of the sub-piping 40.

A female thread portion is formed in an inner peripheral surface of the boss portion 48. The male thread portion 104A of the shaft portion 104 is fastened to the boss portion 48. Accordingly, the upstream connection portion 86 is detachably attached to the sub-piping 40 in a state where the one end portion 84E1 of the internal flow path 84 is connected or coupled with the flow path 40A of the sub-piping 40. In this state, the cooling medium W is supplied from the flow path 40A of the one piece of the sub-piping 40 to the one end portion 84E1 of the internal flow path 84.

As illustrated in FIG. 6, the other end portion 84E2 of the internal flow path 84 is formed in the downstream connection portion 94. Further, the downstream connection portion 94 includes a similar configuration to the upstream connection portion 86. The downstream connection portion 94 is detachably attached to the one piece of the sub-piping 40 by the attachment member 100 in a state where the other end portion 84E2 of the internal flow path 84 is connected or coupled with the flow path 40A of the sub-piping 40. Accordingly, the cooling medium is discharged from the other end portion 84E2 of the internal flow path 84 to the flow path 40A of the one piece of the sub-piping 40.

Next, a description will be made about the attachment structure of the cooling apparatus (cooler) 82 to the other piece of the sub-piping 40. The cooling apparatus 82 includes two attachment portions 96 that are detachably attached to the other piece of the sub-piping 40. Plural connection holes 46 are also formed in the other piece of the sub-piping 40.

The two attachment portions 96 have similar configurations to the above-described upstream connection portion 86 and downstream connection portion 94 and are detachably attached to the other piece of the sub-piping 40 by the attachment members 100. However, the internal flow path 84 is not formed in the two attachment portions 96. Accordingly, as indicated by arrows F, the cooling medium that is supplied from the one piece of the sub-piping 40 to the one end portion 84E1 of the internal flow path 84 is not discharged to the other piece of the sub-piping 40 but is discharged from the other end portion 84E2 of the internal flow path 84 to the one piece of the sub-piping 40.

The connection holes 46, in which the attachment members 100 are not inserted, among the plural connection holes 46 of the sub-piping 40 are blocked by lid members 110. Specifically, as illustrated in FIG. 8A, the lid member 110 includes a lid portion 112 and a shaft portion 114.

The lid portion 112 is formed into a disk shape. Further, for example, grooves in a cross shape, with which a tool such as a driver engages, is formed in a surface of the lid portion 112. The lid portion 112 is situated on the upper surface of the sub-piping 40 via the sealing member 90. The lid portion 112 closes the connection hole 46. Further, the sealing member 90 in a ring shape that surrounds the connection hole 46 restrains the cooling medium W from leaking from the connection hole 46.

The shaft portion 114 extends out from a lower surface of the lid portion 112 and is inserted in the connection hole 46. A male thread portion 114A is provided in a tip portion of the shaft portion 114. Meanwhile, the above-described boss portion 48 is formed on the bottom portion of the sub-piping 40. A female thread portion is formed in the inner peripheral surface of the boss portion 48. The male thread portion 114A of the shaft portion 114 is fastened to the boss portion 48. Accordingly, the lid member 110 is detachably attached to the sub-piping 40.

<Blocking Structure of Flow Path>

As illustrated in FIG. 6, the sub-piping 40 of this embodiment is provided with a blocking portion 108 that blocks the flow path 40A between the upstream connection portion 86 and the downstream connection portion 94. Specifically, as illustrated in FIG. 8B, the connection hole 46 that is formed in the blocking portion 108 is closed by the above-described lid member 110.

Further, in the blocking portion 108, a blocking material 116 such as a water absorbing polymer is filled in the flow path 40A through the connection hole 46. The blocking material 116 blocks the flow path 40A. Accordingly, as indicated by arrows F in FIG. 6, the cooling medium is facilitated to flow from the flow path 40A of the one piece of the sub-piping 40 via the upstream connection portion 86 to the one end portion 84E1 of the internal flow path 84. Accordingly, the cooling efficiency of the electronic component 14 is improved.

Next, functions of the second embodiment will be described.

As illustrated in FIG. 6, the cooling module 80 includes the cooling apparatus (cooler) 82 that is arranged across the pair of pieces of the sub-piping 40. The cooling apparatus 82 has the internal flow path 84. The one end portion 84E1 of the internal flow path 84 is connected or coupled with the flow path 40A of the one piece of the sub-piping 40 in the upstream connection portion 86. Accordingly, the cooling medium is supplied from the one piece of the sub-piping 40 to the one end portion 84E1 of the internal flow path 84.

Further, the other end portion 84E2 of the internal flow path 84 is connected or coupled with the flow path 40A of the one piece of the sub-piping 40 in the downstream connection portion 94. Accordingly, the cooling medium in the internal flow path 84 is discharged from the other end portion 84E2 of the internal flow path 84 to the flow path 40A of the one piece of the sub-piping 40.

Here, a portion of the internal flow path 84 is arranged in the heat absorbing portion 82S of the cooling apparatus 82. Accordingly, in the heat absorbing portion 82S, heat exchange is performed between the cooling medium that flows through the internal flow path 84 and the electronic component 14. Accordingly, the electronic component 14 is cooled.

As described above, in this embodiment, heat exchange is performed between the cooling medium and the electronic component 14, and the electronic component 14 is thereby cooled. Accordingly, the cooling efficiency of the electronic component 14 is improved.

Further, the blocking portion 108 is provided in the sub-piping 40. The blocking portion 108 is provided between the upstream connection portion 86 and the downstream connection portion 94. In the blocking portion 108, the flow path 40A of the one piece of the sub-piping 40 is blocked by the blocking material 116. Accordingly, as indicated by arrows F in FIG. 6, the cooling medium is facilitated to be supplied from the flow path 40A of the one piece of the sub-piping 40 via the upstream connection portion 86 to the one end portion 84E1 of the internal flow path 84. Accordingly, the cooling efficiency of the electronic component 14 is further improved.

Further, the cooling apparatus 82 is detachably connected or coupled with the pair of pieces of the sub-piping 40 by the attachment members 100. Accordingly, similarly to the above first embodiment, the effort for the replacement work of the electronic component 14 is reduced.

[Modification Examples]

Next, modification examples of the second embodiment will be described.

Figure 9:
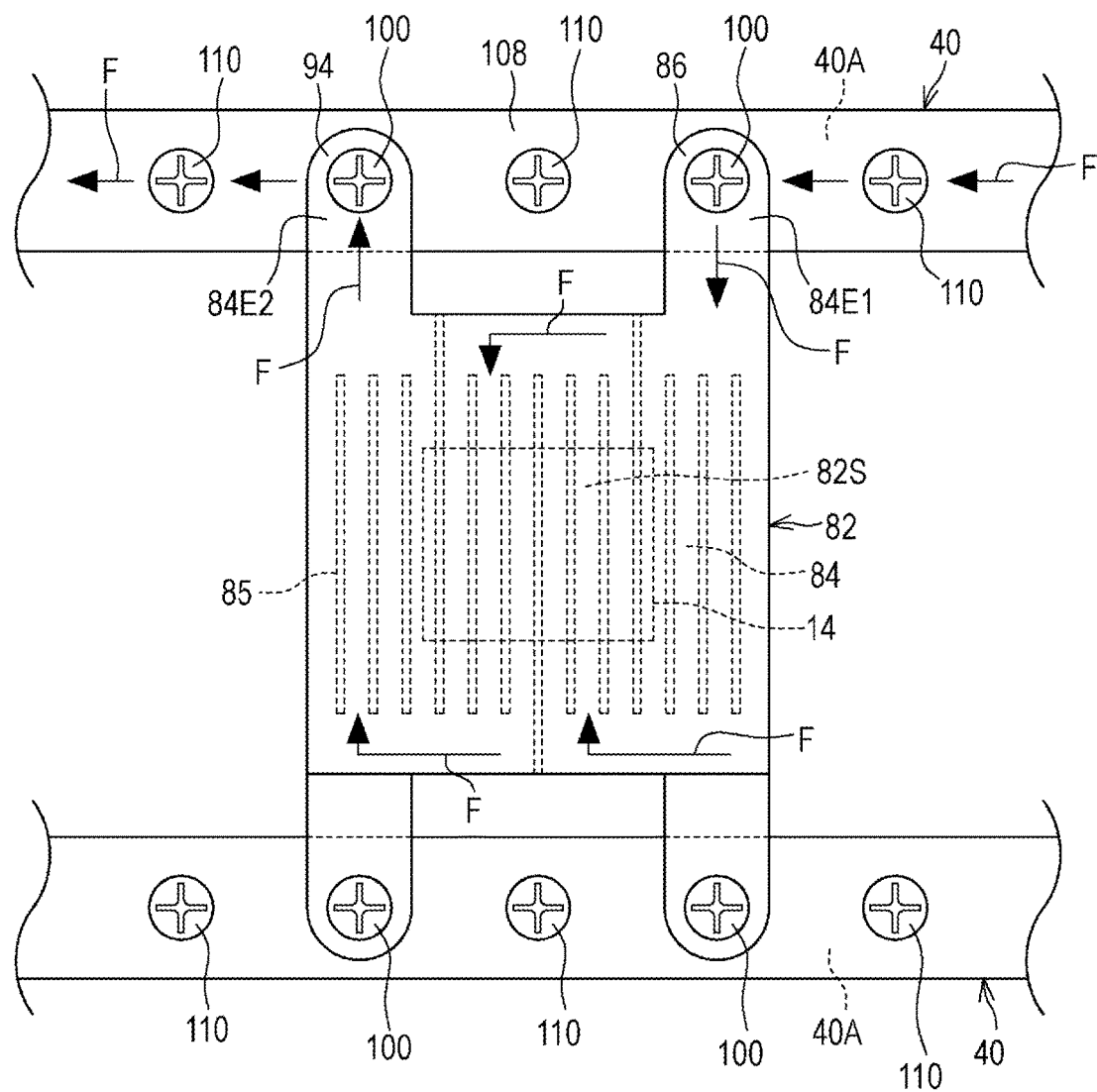
FIG. 9 is a plan view that illustrates a modification example of the cooler in the second embodiment and corresponds to FIG. 6.
Figure 10:
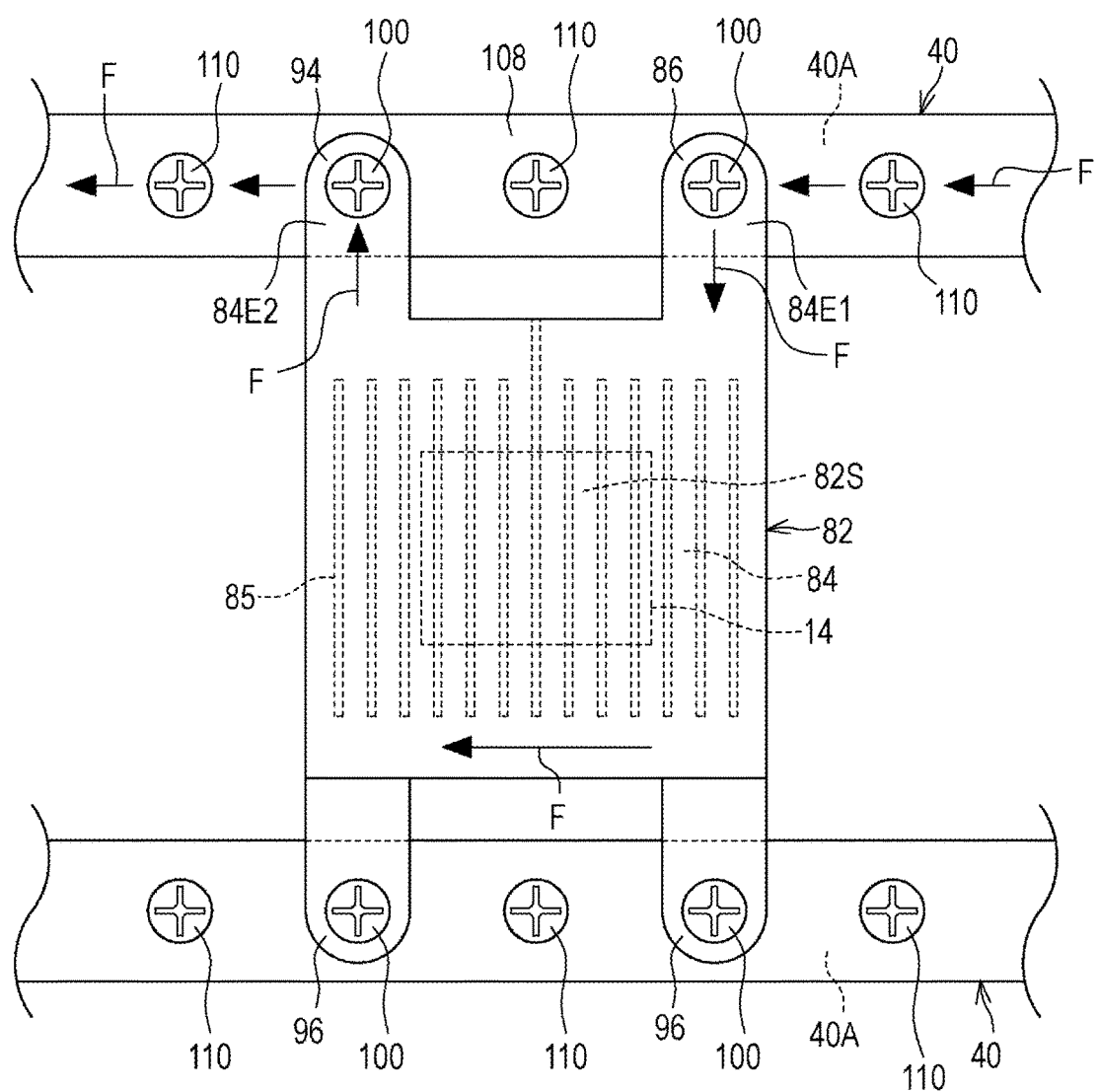
FIG. 10 is a plan view that illustrates a modification example of the cooler in the second embodiment and corresponds to FIG. 6.
Figure 11:
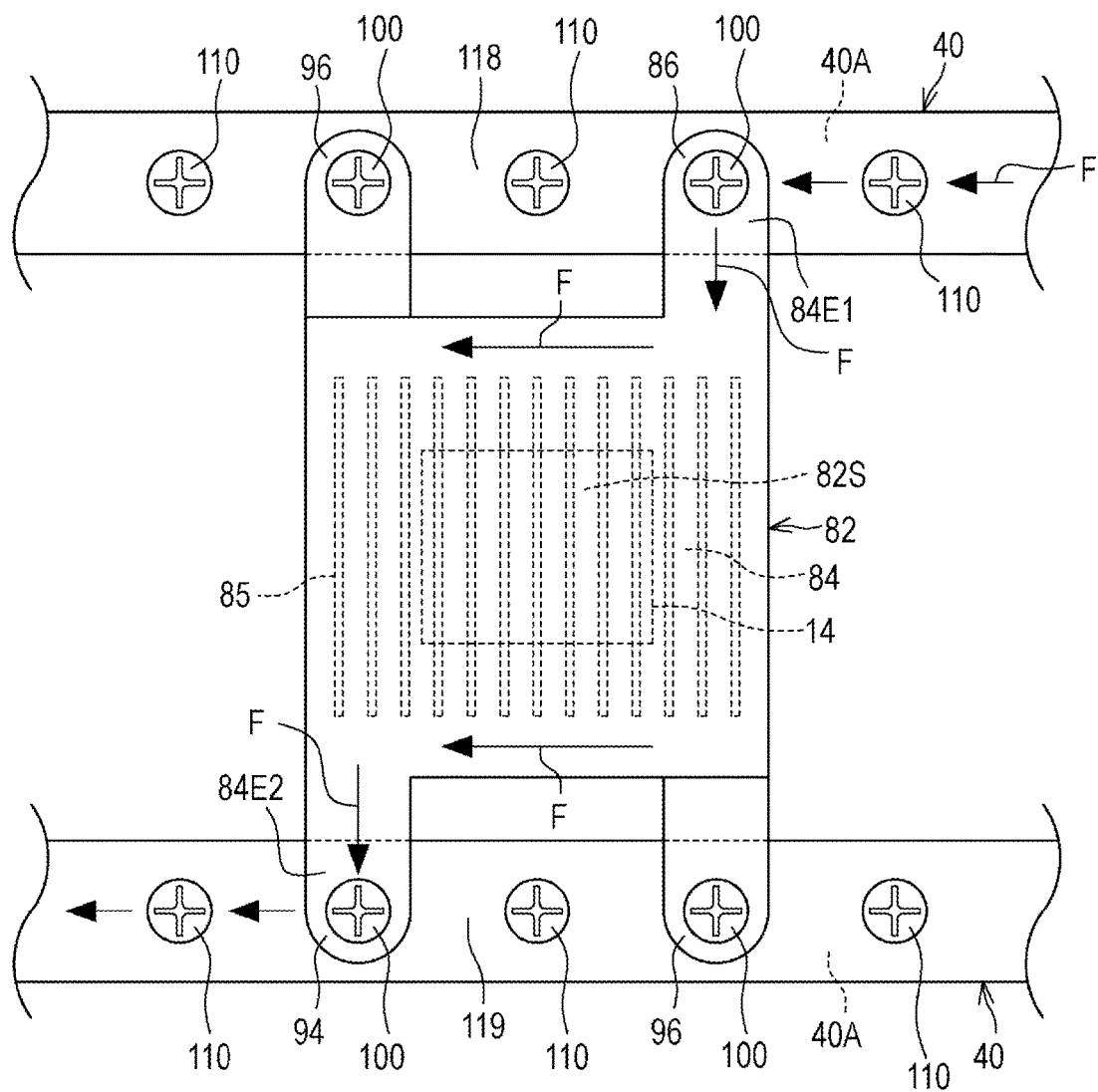
FIG. 11 is a plan view that illustrates a modification example of the cooler in the second embodiment and corresponds to FIG. 6.

As the modification examples illustrated in FIGS. 9 and 10, the shape of the internal flow path 84 of the cooling apparatus (cooler) 82 may appropriately be changed. Further, in the modification example illustrated in FIG. 11, the upstream connection portion 86 is detachably connected or coupled with the one piece of the sub-piping 40, and the downstream connection portion 94 is detachably connected or coupled with the other piece of the sub-piping 40. In this case, as for the internal flow path 84, the cooling medium is supplied from the flow path 40A of the one piece of the sub-piping 40 via the upstream connection portion 86 to the one end portion 84E1 of the internal flow path 84. Further, the cooling medium in the internal flow path 84 is discharged from the other end portion 84E2 of the internal flow path 84 via the downstream connection portion 94 to the flow path 40A of the other piece of the sub-piping 40.

Further, a downstream blocking portion 118 is provided in the one piece of the sub-piping 40. The downstream blocking portion 118 blocks the flow path 40A of the one piece of the sub-piping 40 on a downstream side of the connection hole 46 with which the one end portion 84E1 of the internal flow path 84 is connected or coupled. Accordingly, the cooling medium is facilitated to flow from the flow path 40A of the one piece of the sub-piping 40 to the one end portion 84E1 of the internal flow path 84.

Further, an upstream blocking portion 119 is provided in the other piece of the sub-piping 40. The upstream blocking portion 119 blocks the flow path 40A of the other piece of the sub-piping 40 on an upstream side of the connection hole 46 with which the other end portion 84E2 of the internal flow path 84 is connected. Accordingly, the cooling medium is restrained from flowing backward from the flow path 40A of the other piece of the sub-piping 40 to the other end portion 84E2 of the internal flow path 84. The downstream blocking portion 118 and the upstream blocking portion 119 have similar configurations to the above-described blocking portion 108 (see FIG. 8B).

Third Embodiment

Next, the third embodiment will be described. In the third embodiment, members in the same configurations as the first and second embodiments are provided with the same reference characters, and descriptions thereof will appropriately be omitted.

As illustrated in FIG. 12, the cooling module 120 according to the third embodiment includes the cooling apparatus (cooler) 122. The cooling apparatus 122 is a radiator that cools wind V flowing to the electronic components 14 and thereby cools the electronic components 14, for example.

Specifically, the cooling apparatus 122 includes an internal flow path 122A. Further, the cooling apparatus 122 includes the upstream connection portion 86 and the downstream connection portion 94. The upstream connection portion 86 is detachably connected or coupled with one piece of the sub-piping 40. Accordingly, the cooling medium is supplied from the flow path 40A of the one piece of the sub-piping 40 via the upstream connection portion 86 to one end portion of the internal flow path 122A.

Meanwhile, the downstream connection portion 94 is detachably connected or coupled with the other piece of the sub-piping 40. Accordingly, the cooling medium in the internal flow path 122A is discharged from the other end portion of the internal flow path 122A via the downstream connection portion 94 to the flow path 40A of the other piece of the sub-piping 40. Each of the pair of pieces of the sub-piping 40 may be provided with a blocking portion that blocks the flow path 40A.

Here, the information processing device 10 according to the third embodiment is provided with an air blower (fan) 124 that delivers the wind to the electronic components 14. Further, upstream electronic components 16 that are arranged on an upstream side of the wind V with respect to the electronic components 14 are mounted on the mounting surface 12A of the substrate 12. The cooling apparatus 122 is arranged between the upstream electronic components 16 and the electronic components (downstream electronic components) 14. The electronic components 14 and the upstream electronic components 16 are memories, for example.

Next, functions of the third embodiment will be described.

As illustrated in FIG. 12, when the air blower 124 operates, the wind V that flows to the upstream electronic components 16 is generated. The wind V cools the upstream electronic components 16. Next, the wind V that passes through the upstream electronic components 16 passes through the cooling apparatus (cooler) 122. In this case, the wind V is cooled by the cooling medium that flows through the internal flow path 122A of the cooling apparatus 122. Next, the wind V that passes through the cooling apparatus 122 passes through the electronic components 14. The wind V cools the electronic components 14.

Here, in FIG. 12, the temperature of the wind V in a case where the cooling apparatus 122 is present is represented by line G1. Further, in FIG. 12, as a comparative example, the temperature of the wind V in a case where the cooling apparatus 122 is not present is represented by line G2. The horizontal axis of lines G1 and G2 is the distance from the downstream joints 32.

As it is understood from line G2, in a case where the cooling apparatus 122 is not present, the wind V is heated while passing through the upstream electronic components 16, and the temperature rises. Subsequently, the wind V passes through the electronic components 14 with the raised temperature. Accordingly, the cooling efficiency of the electronic component 14 lowers.

On the other hand, in this embodiment, as it is understood from line G1, the wind V that passes through the upstream electronic components 16 is cooled by the cooling apparatus 122, and the temperature lowers. Subsequently, the wind V passes through the electronic components 14. Accordingly, in this embodiment, the cooling efficiency of the electronic component 14 is improved.

Further, in this embodiment, as it is understood from line G1, the temperature of the wind V at a time before passing through the upstream electronic components 16 may be made substantially the same as the temperature of the wind V that passes through the electronic components 14. That is, the temperature of the wind V that flows into the information processing device 10 may be made substantially the same as the temperature of the wind V that flows out from the information processing device 10. Accordingly, for example, a temperature rise of a server room in which the information processing device 10 is placed is suppressed. As a result, the air conditioning load in the server room is decreased.

Incidentally, in a case where the cooling apparatus 122 is arranged adjacently to the electronic components 14, when the worker replaces the electronic component 14, the electronic component 14 or a hand of the worker possibly interferes with the cooling apparatus 122. In this case, replacement work of the electronic component 14 possibly requests effort.

On the other hand, in this embodiment, the cooling apparatus 122 is detachably connected or coupled with the pair of pieces of the sub-piping 40. Accordingly, in a case where the worker replaces the electronic component 14, the cooling apparatus 122 may be removed from the substrate 12 without removing the sub-piping 40 from the substrate 12. Accordingly, the effort for the replacement work of the electronic component 14 is reduced.

In this embodiment, the upstream electronic components 16 are arranged on an upstream side of the cooling apparatus 122. However, it is possible to omit the upstream electronic components 16.

Next, modification examples of the first to third embodiments will be described. In the following, various kinds of modification examples will be described about the first embodiment as an example. However, it is possible to appropriately apply those modification examples to the second and third embodiments.

Further, in the above first embodiment, the pieces of the sub-piping 40 are arranged on both sides of the electronic component 14. However, the sub-piping 40 may be arranged only on one side of the electronic component 14. For example, in a case where the sub-piping 40 is not arranged on the other end portion 52E2 side of the cooling apparatus (cooler) 52, the other end portion 52E2 is attached to the substrate 12 via a spacer, which is not illustrated, or the like.

Further, in the first embodiment, it is possible to appropriately change the arrangement, the numbers of pieces, and the structures of the upstream main piping 22, the downstream main piping 30, and the sub-piping 40.

Further, the cooling unit 20 according to the first embodiment includes the upstream main piping 22, the downstream main piping 30, and the sub-piping 40. However, it is possible to omit the upstream main piping 22 and the downstream main piping 30. In a case where the upstream main piping 22 and the downstream main piping 30 are omitted, for example, the cooling-medium cooling device is connected or coupled with the flow passage via piping or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing device comprising:
   a substrate configured to include a mounting surface above which an electronic component is mounted;
   a cooling unit comprising:
   an upstream main piping configured to include an upstream flow path through which a cooling medium flows and plural upstream joints which communicate with the upstream flow path;
   a downstream main piping configured to include a downstream flow path through which the cooling medium flows and plural downstream joints which communicate with the downstream flow path; and
   a pair of flow passages configured to each include a flow path through which the cooling medium flows and be each arranged above the mounting surface, each of the pair of flow passages detachably coupled with any one of the plural upstream joints in a state where the flow path is coupled with the upstream flow path and with any one of the plural downstream joints in a state where the flow path is coupled with the downstream flow path, each of the pair of flow passages includes plural connection holes that communicate with the flow path of a respective one of the pair of flow passages,
   wherein the electronic component is arranged between the pair of the flow passages; and
   a cooler configured to be detachably coupled with each of the pair of flow passages and is arranged across the pair of flow passages, the cooler cools the electronic component, the cooler includes an internal flow path, one end portion of the internal flow path is detachably coupled with any one of the plural connection holes of either first or second ones of the pair of flow passages, and another end portion of the internal flow path is detachably coupled with another connection hole among the plural connection holes of the either first or second ones of the pair of flow passages that is different from the any one of the plural connection holes with which the one end portion of the internal flow path is coupled,
   wherein the downstream flow path is arranged on an opposite side to the upstream flow path with respect to the cooler.

2. The information processing device according to claim 1,
   wherein the upstream flow passage is arranged along one end portion of the mounting surface.

3. The information processing device according to claim 2,
   wherein the downstream flow passage is arranged along another end portion of the mounting surface.

4. The information processing device according to claim 1,
   wherein the cooler includes a heat absorbing portion which is arranged above the electronic component and performs heat exchange with the electronic component.

5. The information processing device according to claim 4,
   wherein the cooling medium flows through the internal flow path, a portion of the internal flow path is arranged in the heat absorbing portion.

6. The information processing device according to claim 5,
   wherein one of the flow passages is provided with a blocking portion that blocks the flow path between the any one of the plural connection holes of the one of the flow passages with which the one end portion of the internal flow path is coupled and the another connection hole of the one of the flow passages with which the another end portion of the internal flow path is coupled.

7. The information processing device according to claim 5, wherein the one end portion of the internal flow path is detachably coupled with the any one of the plural connection holes of the first one of the pair of flow passages, and the another end portion of the internal flow path is detachably coupled with any of the another connection holes of the second one of the pair of flow passages.

8. The information processing device according to claim 7, wherein the first one of the pair of flow passages is provided with a downstream blocking portion that blocks the flow path above a downstream side of the any one of the plural connection holes with which the one end portion of the internal flow path is coupled.

9. The information processing device according to claim 7, wherein the second one of the pair of flow passages is provided with an upstream blocking portion that blocks the flow path above an upstream side of the another connection hole with which the another end portion of the internal flow path is coupled.

10. The information processing device according to claim 1, wherein the cooler is heat conductive and performs heat exchange with at least one of the flow passages in a state when the cooler is coupled with the pair of flow passages.

11. The information processing device according to claim 10, wherein each of the pair of flow passages has a connection surface with which the cooler makes surface contact.

12. The information processing device according to claim 10, wherein a second cooler includes a heat pipe that performs heat exchange between a second electronic component and at least one of each of the flow passages or each of a second pair of flow passages.

13. The information processing device according to claim 1, further comprising:

an air blower configured to generate wind which flows to the electronic component, wherein the cooler cools the wind that flows from the air blower to the electronic component.

14. The information processing device according to claim 13, further comprising:

an upstream electronic component that is arranged above an upstream side, with respect to the electronic component, of the wind which is generated by the air blower, wherein the cooler is arranged between the electronic component and the upstream electronic component.

15. A cooling unit comprising:

an upstream main piping configured to include an upstream flow path through which a cooling medium flows and plural upstream joints which communicate with the upstream flow path;

a downstream main piping configured to include a downstream flow path through which the cooling medium flows and plural downstream joints which communicate with the downstream flow path;

a pair of flow passages configured to each include a flow path through which the cooling medium flows and be each arranged above a mounting surface, each of the pair of flow passages detachably coupled with any one of the plural upstream joints in a state where the flow path is coupled with the upstream flow path and with any one of the plural downstream joints in a state where the flow path is coupled with the downstream flow path, each of the pair of flow passages includes plural connection holes that communicate with the flow path of a respective one of the pair of flow passages, wherein an electronic component is arranged between the pair of the flow passages; and a cooler configured to be detachably coupled with each of the pair of flow passages and is arranged across the pair of flow passages, the cooler cools the electronic component, the cooler includes an internal flow path, one end portion of the internal flow path is detachably coupled with any one of the plural connection holes of either first or second ones of the pair of flow passages, and another end portion of the internal flow path is detachably coupled with another connection hole among the plural connection holes of the either first or second ones of the pair of flow passages that is different from the any one of the plural connection holes with which the one end portion of the internal flow path is coupled, wherein the downstream flow path is arranged on an opposite side to the upstream flow path with respect to the cooler.

16. The cooling unit according to claim 15, wherein the cooler includes a heat absorbing portion which is arranged above the electronic component and performs heat exchange with the electronic component, and wherein the cooling medium flows through the internal flow path, a portion of the internal flow path is arranged in the heat absorbing portion.

17. The cooling unit according to claim 16, wherein one of the flow passages is provided with a blocking portion that blocks the flow path between the any one of the plural connection holes of the one of the flow passages with which the one end portion of the internal flow path is coupled and the another connection hole of the one of the flow passages with which the other another end portion of the internal flow path is coupled.

18. The cooling unit according to claim 16, wherein the one end portion of the internal flow path is detachably coupled with the any one of the plural connection holes of the first one of the pair of flow passages, and the another end portion of the internal flow path is detachably coupled with any of the another connection holes of the second one of the pair of flow passages.

19. The cooling unit according to claim 18, wherein the first one of the pair of flow passages is provided with a downstream blocking portion that blocks the flow path above a downstream side of the any one of the plural connection holes with which the one end portion of the internal flow path is coupled.

20. The cooling unit according to claim 18, wherein the second one of the pair of flow passages is provided with an upstream blocking portion that blocks the flow path above an upstream side of the another connection hole with which the another end portion of the internal flow path is coupled.

* * * * *